(12) United States Patent
Anderson et al.

(10) Patent No.: US 10,811,507 B2
(45) Date of Patent: Oct. 20, 2020

(54) VERTICAL TRANSISTORS HAVING MULTIPLE GATE THICKNESSES FOR OPTIMIZING PERFORMANCE AND DEVICE DENSITY

(71) Applicant: International Business Machines Corporation, Armonk, NY (US)

(72) Inventors: Brent A. Anderson, Jericho, VT (US); Fee Li Lie, Albany, NY (US); Stuart A. Sieg, Albany, NY (US); Junli Wang, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 93 days.

(21) Appl. No.: 15/709,902

(22) Filed: Sep. 20, 2017

(65) Prior Publication Data

US 2019/0088754 A1 Mar. 21, 2019

(51) Int. Cl.
*H01L 29/423* (2006.01)
*H01L 27/088* (2006.01)
(Continued)

(52) U.S. Cl.
CPC .......... *H01L 29/42372* (2013.01); *H01L 21/823456* (2013.01); *H01L 27/0207* (2013.01);
(Continued)

(58) Field of Classification Search
CPC ......... H01L 29/78642; H01L 29/66666; H01L 21/823487; H01L 21/823885;
(Continued)

(56) References Cited

U.S. PATENT DOCUMENTS 6,383,871 B1   5/2002   Noble et al.
6,406,962 B1 *  6/2002   Agnello ................ H01L 21/84
                                                    257/E21.703
(Continued)

OTHER PUBLICATIONS

Anderson et al., "Vertical Transistors Having Multiple Gate Thicknesses," U.S. Appl. No. 15/803,918, filed Nov. 6, 2017.
(Continued)

*Primary Examiner* — Dung A. Le
(74) *Attorney, Agent, or Firm* — Cantor Colburn LLP

(57) ABSTRACT

Embodiments of the invention are directed to configurations of semiconductor devices. A non-limiting example configuration includes a plurality of first transistors formed over a performance region of a major surface of a substrate. Each of the plurality of first transistors includes a first channel fin structure and a first gate structure along at least a portion of a sidewall surface of the first channel fin structure. The first gate structure includes a first gate thickness dimension. A plurality of second transistors is formed over a density region of the major surface of the substrate. Each of the plurality of second transistors includes a second channel fin structure and a second gate structure along at least a portion of a sidewall surface of the second channel fin structure, where the second gate structure includes a second gate thickness dimension that is less than the first gate thickness dimension.

8 Claims, 7 Drawing Sheets

(51) Int. Cl.
  *H01L 29/06* (2006.01)
  *H01L 29/66* (2006.01)
  *H01L 29/786* (2006.01)
  *H01L 29/78* (2006.01)
  *H01L 27/02* (2006.01)
  *H01L 21/8234* (2006.01)

(52) U.S. Cl.
  CPC ........ *H01L 27/088* (2013.01); *H01L 29/0649* (2013.01); *H01L 29/42384* (2013.01); *H01L 29/66666* (2013.01); *H01L 29/66742* (2013.01); *H01L 29/7856* (2013.01); *H01L 29/78642* (2013.01)

(58) Field of Classification Search
  CPC ........... H01L 29/7856; H01L 29/42384; H01L 29/42372; H01L 29/42376; H01L 21/82385; H01L 27/0207; H01L 29/78645; H01L 29/78648
  See application file for complete search history.

(56) References Cited

U.S. PATENT DOCUMENTS

| | | | |
|---|---|---|---|
| 6,610,575 B1 | 8/2003 | Ang et al. | |
| 6,686,604 B2 | 2/2004 | Layman et al. | |
| 6,800,927 B2 | 10/2004 | Noble et al. | |
| 6,887,749 B2 | 5/2005 | Noble et al. | |
| 7,023,041 B2 | 4/2006 | La Rosa et al. | |
| 7,056,783 B2 | 6/2006 | Layman et al. | |
| 7,271,467 B2 | 9/2007 | Noble et al. | |
| 8,722,494 B1 | 5/2014 | Basker et al. | |
| 9,018,686 B2 | 4/2015 | Basker et al. | |
| 9,437,503 B1* | 9/2016 | Mallela | H01L 21/8238 |
| 9,461,044 B1* | 10/2016 | Chang | H01L 27/0886 |
| 9,786,788 B1* | 10/2017 | Anderson | H01L 29/78642 |
| 2006/0046391 A1* | 3/2006 | Tang | H01L 27/10876 438/268 |
| 2014/0065802 A1* | 3/2014 | Chang | H01L 21/845 438/479 |
| 2014/0374840 A1* | 12/2014 | Lee | H01L 27/0886 257/401 |
| 2015/0069501 A1* | 3/2015 | Colinge | H01L 29/7827 257/329 |
| 2015/0097250 A1* | 4/2015 | Cheon | H01L 27/0886 257/401 |
| 2016/0079353 A1* | 3/2016 | Chen | H01L 27/0886 257/401 |
| 2016/0260719 A1* | 9/2016 | Chung | H01L 27/1104 |
| 2016/0276485 A1* | 9/2016 | Kim | H01L 29/7856 |
| 2016/0284697 A1* | 9/2016 | Yoon | H01L 27/088 |
| 2016/0315165 A1* | 10/2016 | Lee | H01L 29/512 |
| 2016/0329899 A1* | 11/2016 | Masuoka | H01L 27/0207 |
| 2017/0033013 A1* | 2/2017 | Kim | H01L 21/823431 |
| 2017/0054027 A1* | 2/2017 | Liu | H01L 29/7855 |
| 2017/0221906 A1* | 8/2017 | Lin | H01L 21/3065 |
| 2017/0236821 A1* | 8/2017 | Kim | H01L 21/82345 257/401 |
| 2017/0373189 A1* | 12/2017 | Lee | H01L 21/845 |
| 2018/0190817 A1* | 7/2018 | Wu | H01L 29/401 |
| 2018/0254218 A1* | 9/2018 | Cheng | H01L 21/823462 |
| 2019/0051659 A1* | 2/2019 | Xie | H01L 29/40114 |

OTHER PUBLICATIONS

List of IBM Patents or Patent Applications Treated as Related; Date Filed: Sep. 20, 2017, 2 pages.

* cited by examiner

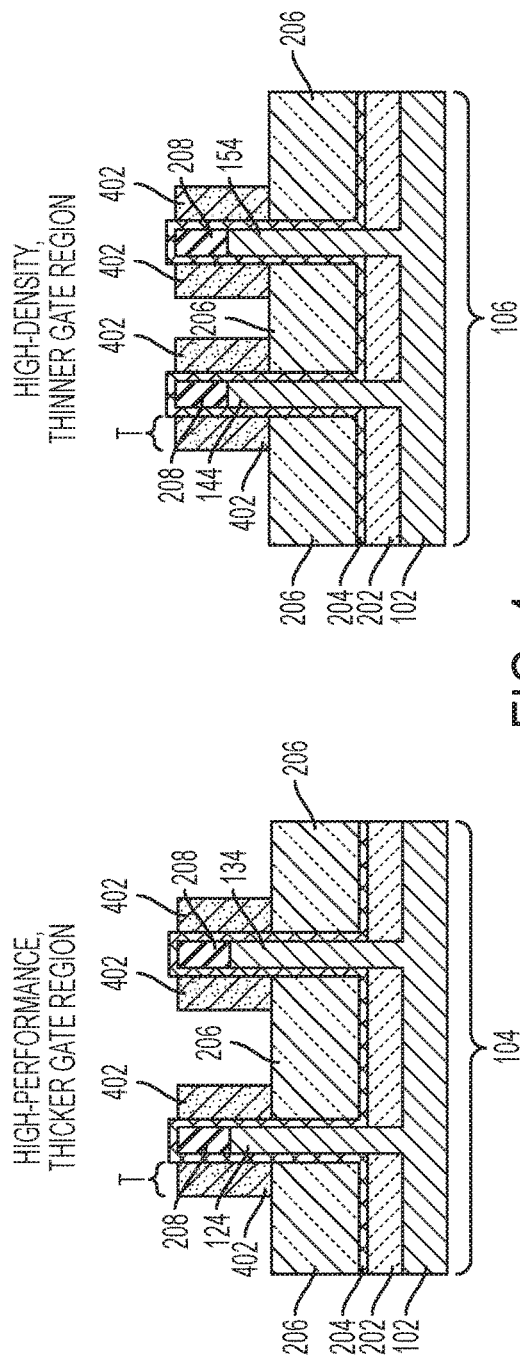
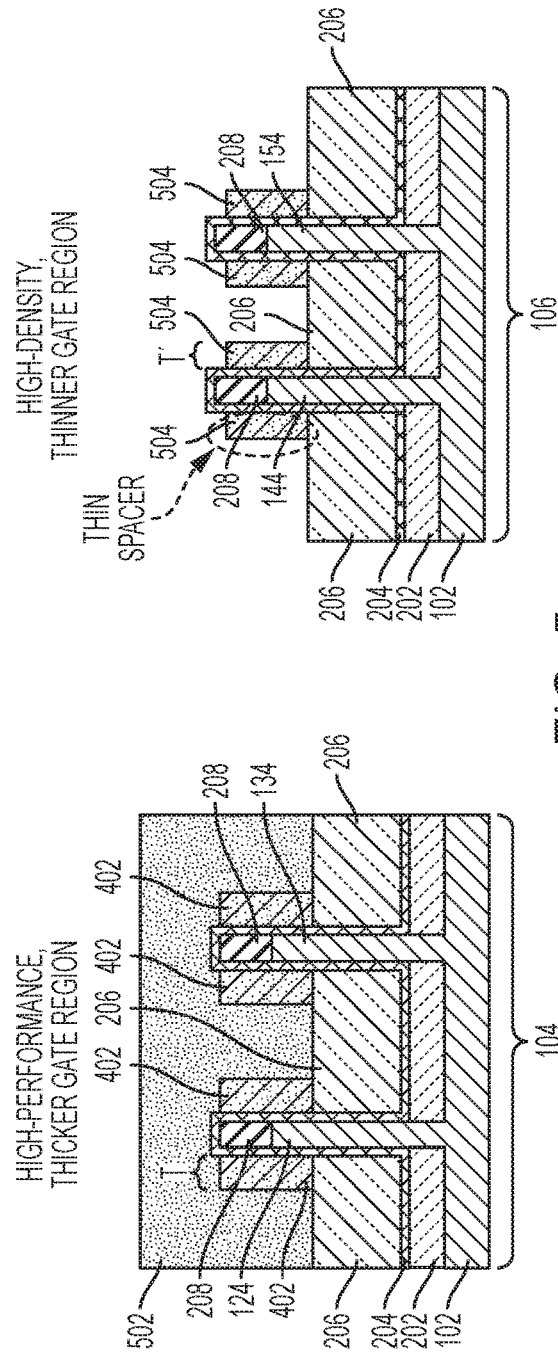

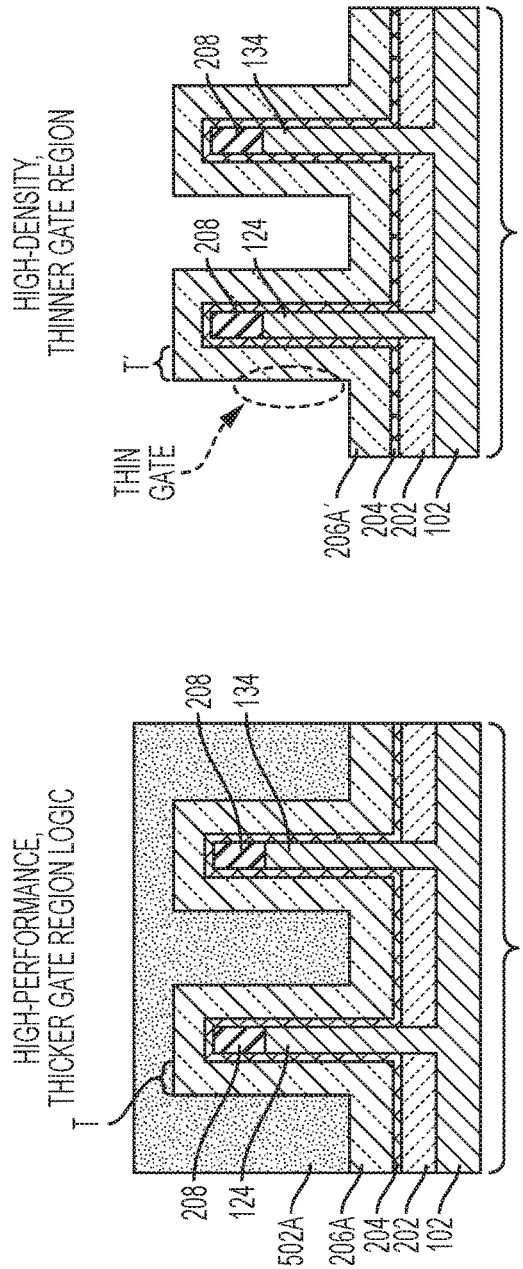
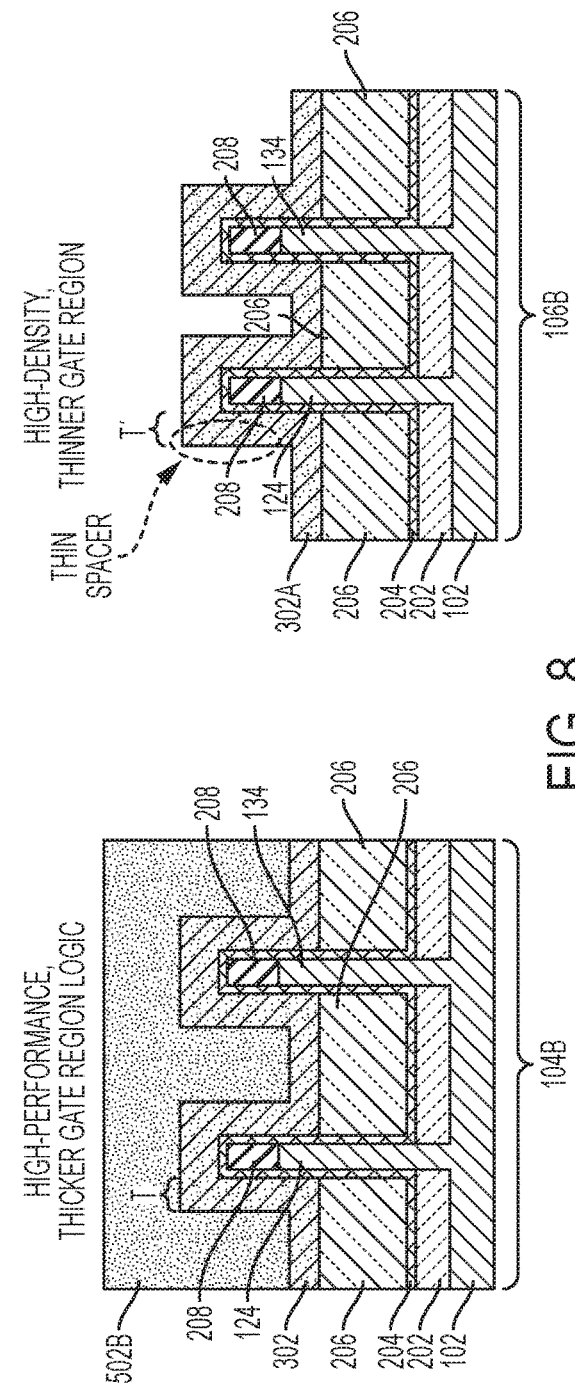
FIG. 7
FIG. 8

VERTICAL TRANSISTORS HAVING MULTIPLE GATE THICKNESSES FOR OPTIMIZING PERFORMANCE AND DEVICE DENSITY

BACKGROUND

The present invention relates in general to semiconductor devices and their fabrication. More specifically, the present invention relates to improved fabrication methodologies and resulting structures for vertical field effect transistors (VFETs) having multiple gate thicknesses for optimizing performance and device density.

Semiconductor devices are typically formed using active regions of a wafer. In an integrated circuit (IC) having a plurality of metal oxide semiconductor field effect transistors (MOSFETs), each MOSFET has a source and a drain that are formed in an active region of a semiconductor layer by implanting n-type or p-type impurities in the layer of semiconductor material. The term "planar" is used to describe a conventional geometry for MOSTFETs in which the various component parts of the MOSFET device are laid down as planes or layers.

VFETs are one example of a non-planar type of MOSFET geometry. VFETs employ semiconductor fins and side-gates that can be contacted outside the active region, resulting in increased device density and some increased performance over planar (or lateral) devices. In VFETs the source to drain current flows in a direction that is perpendicular to a major surface of the substrate. For example, in a known VFET configuration a major substrate surface extends horizontally and a vertical fin extends upward from the substrate's major surface. The fin forms the channel region of the transistor. A source region and a drain region are in electrical contact with the top and bottom ends of the channel region, and a gate is disposed on one or more of the fin sidewalls. An important parameter in designing VFET semiconductor devices is the selection of the gate thickness dimension.

SUMMARY

Embodiments of the invention are directed to methods of forming a configuration of semiconductor devices. A non-limiting example method includes forming a first channel fin structure over a performance region of a major surface of a substrate. A first gate structure is formed along at least a portion of a sidewall surface of the first channel fin structure, where the first gate structure includes a first gate thickness dimension. A second channel fin structure is formed over a density region of the major surface of the substrate. A second gate structure is formed along at least a portion of a sidewall surface of the second channel fin structure, where the second gate structure includes a second gate thickness dimension that is less than the first gate thickness dimension.

Embodiments of the invention are directed to methods of forming a configuration of semiconductor devices. A non-limiting example method includes forming a plurality of first channel fin structures over a performance region of a major surface of a substrate. A first gate structure is formed along at least a portion of a sidewall surface of each of the plurality of first channel fin structures, where the first gate structure includes a first gate thickness dimension. A plurality of second channel fin structures is formed over a density region of the major surface of the substrate. A second gate structure is formed along at least a portion of a sidewall surface of each of the plurality of second channel fin structures, where the second gate structure includes a second gate thickness dimension that is less than the first gate thickness dimension.

Embodiments of the invention are directed to configurations of semiconductor devices. A non-limiting example configuration includes a plurality of first transistors formed over a performance region of a major surface of a substrate. Each of the plurality of first transistors includes a first channel fin structure and a first gate structure along at least a portion of a sidewall surface of the first channel fin structure. The first gate structure includes a first gate thickness dimension. A plurality of second transistors is formed over a density region of the major surface of the substrate. Each of the plurality of second transistors includes a second channel fin structure and a second gate structure along at least a portion of a sidewall surface of the second channel fin structure, where the second gate structure includes a second gate thickness dimension that is less than the first gate thickness dimension.

Additional features and advantages are realized through the techniques described herein. Other embodiments and aspects are described in detail herein. For a better understanding, refer to the description and to the drawings.

BRIEF DESCRIPTION OF THE DRAWINGS

The subject matter which is regarded as the present invention is particularly pointed out and distinctly claimed in the claims at the conclusion of the specification. The foregoing and other features and advantages are apparent from the following detailed description taken in conjunction with the accompanying drawings in which:

FIG. 4 depicts a cross-sectional view of a semiconductor substrate having a performance region and a density region after a fabrication operation according to embodiments of the invention;

FIG. 5 depicts a cross-sectional view of a semiconductor substrate having a performance region and a density region after a fabrication operation according to embodiments of the invention;

FIG. 7 depicts a cross-sectional view of a semiconductor substrate having a high-performance region and a high-density region after a fabrication operation according to embodiments of the invention;

FIG. 8 depicts a cross-sectional view of a semiconductor substrate having a performance region and a density region after a fabrication operation according to embodiments of the invention;

Figure 1:
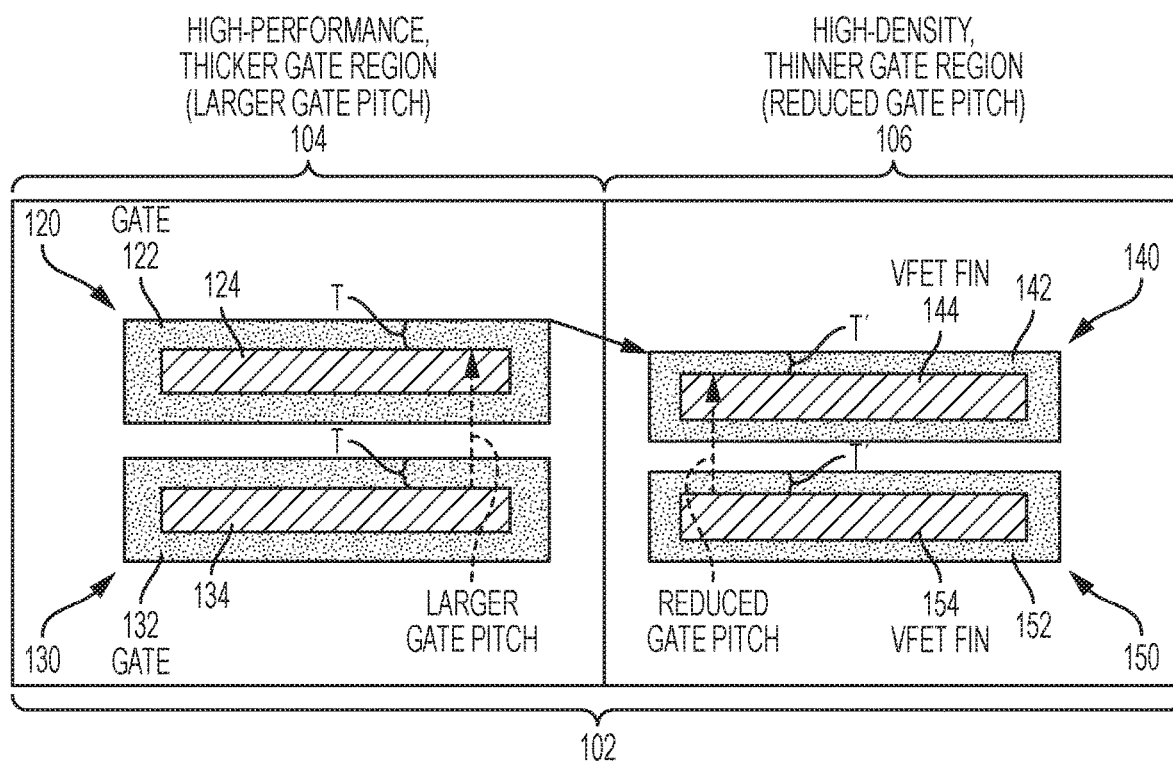
FIG. 1 depicts a top-down view of a semiconductor substrate having a performance region and a density region according to embodiments of the invention.

In the accompanying figures and following detailed description of the embodiments, the various elements illustrated in the figures are provided with three or four digit reference numbers. The leftmost digit(s) of each reference number corresponds to the figure in which its element is first illustrated.

DETAILED DESCRIPTION

It is understood in advance that, although this description includes a detailed description of the formation and resulting structures for a specific type of VFET, implementation of the teachings recited herein are not limited to a particular type of VFET or IC architecture. Rather embodiments of the present invention are capable of being implemented in conjunction with any other type of VFET or IC architecture, now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Spatially relative terms, e.g., "beneath," "below," "lower," "above," "upper," and the like, may or may not be used herein for ease of description to describe one element or feature's relationship to another element(s) or feature(s) as illustrated in the figures. Persons skilled in the art will understand that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

Turning now to an overview of technologies that are more specifically relevant to aspects of the present invention, the design parameters that must be determined for semiconductor transistors that form ICs include gate resistance and device pitch. Gate resistance can be optimized by providing gates with a higher thickness dimension. Optimizing gate resistance to a lower level allows transistors to switch faster and more accurately. For example, it is desirable to construct high performance logic circuits from IC from transistors having relatively thick gates. However, providing transistor gates with a higher thickness dimension limits the minimum transistor pitch (e.g., the center-to-center distance between adjacent transistor structures).

Turning now to an overview of aspects of the present invention, embodiments of the invention provide fabrication methods and resulting structures for providing multiple pitches on a semiconductor wafer/substrate by forming thick gate transistors in selected "performance" regions of the substrate, as well as by forming thin gate transistors in selected "density" regions of the same substrate. By achieving multiple pitches through selectively locating multiple gate thicknesses, embodiments of the invention optimize overall fabrication process complexity by avoiding typical pitch reduction schemes (e.g., by reducing fin thickness or gate dielectric thickness) and the potential performance degradation associated therewith (e.g., thinner fins increase fin resistance for a given gate length; gate dielectric is sensitive to thickness variations and is typically already thin). Accordingly, embodiments of the invention selectively reduce pitch in the dense region while allowing non-gate-thickness parameters (e.g., fin thickness, gate dielectric thickness, gate length, etc.) to be the same in the performance region and in the dense region.

Embodiments of the invention further reduce the pitch in dense regions of the substrate by combining the pitch reduction that results from multiple gate thicknesses with pitch reductions that can be achieved through further leveraging the lower variability (i.e., more repetitive structures) in the dense region. For example, because of the lower variability in the dense region, additional reductions in pitch in the dense region can be achieved by making the gate to gate spacing in the dense region less than the gate to gate spacing in the performance region. As another example, additional reductions in pitch in the dense region can be achieved by making the width of the STI (shallow trench isolation) regions in the dense region less than the width of the STI regions in the performance region.

In embodiments of the invention, the transistors are VFETs. In embodiments of the invention, the performance region includes portions of the IC that require relatively higher performance characteristics. More specifically, for the transistors and other elements that make up the ICs in the performance region, the performance characteristics are more important (or have a higher IC design priority) than the device density characteristics. One example of improving or optimizing a transistor performance characteristic is reducing the transistor's gate resistance. For transistors in the performance region, gate resistance can be optimized by providing gates with a higher thickness dimension. Optimizing gate resistance to a lower level improves transistor performance by allowing the transistor to switch faster and more accurately. For example, many of the high performance characteristics of high performance logic circuits can be achieved by forming the high performance logic circuits from transistors (e.g., VFETs) having relatively thick gates. However, providing transistor gates with a higher thickness dimension limits the minimum transistor pitch (e.g., the center-to-center distance between adjacent transistor structures), which is acceptable for transistors in the performance region because, for transistors in the performance region, the transistor's performance characteristics are more important than transistor density.

In embodiments of the invention, the density region includes portions of the IC that require relatively higher density. More specifically, for the transistors and other elements that make up the ICs in the density region, the device density characteristics are more important (or have a higher IC design priority) than the device performance characteristics. In embodiments of the invention, the transistors and other elements that make up the ICs in the density region can be memory such as static random access memory (SRAM). For memory circuitry, high-performance is less critical and has a lower IC design priority than device density. The memory circuitry in the density region includes various schemes (e.g., redundancy, more repetitive structures, less variability, etc.) that compensate for the higher failure rates that can result from having traded off the lower transistor performance that can result from having thinner gates (and higher gate resistance) in favor of the higher density that can result from having thinner gates. Providing transistor gates with a lower thickness dimension maximizes the transistor pitch (e.g., the center-to-center distance between adjacent transistor structures), which is acceptable for transistors in the density region because, for transistors (e.g., memory) in the density region, the transistor's density is more important and has a higher IC design priority than transistor performance characteristics.

Turning now to a more detailed description of embodiments of the invention, FIG. 1 depicts a top-down view of a semiconductor substrate 102 having a performance region 104 and a density region 106 according to embodiments of the invention. VFETs 120, 130 in the performance region 104 are shown after initial fabrication operations according to embodiments of the invention. For ease of illustration and explanation, two VFETs 120, 130 are shown. However, in practice, any number of VFETs 120, 130 can be provided in the performance region 104. VFETs 140, 150 in the density region 106 are shown after initial fabrication operations according to embodiments of the invention. For ease of illustration and explanation, two VFETs 140, 150 are shown. However, in practice, any number of VFETs 140, 150 can be provided in the density region 106.

Each VFET 120, 130, 140, 150 has been fabricated to a stage at which gate structures 122, 132, 142, 152 have been formed around channel fin structures 124, 134, 144, 154 in accordance with embodiments of the invention. Subsequent fabrication processes (e.g., the formation of source/drain regions, gate contacts, etc.) are applied to the VFETs 120, 130, 140, 150 to form finished VFET semiconductor device. The details of suitable subsequent fabrication processes to form a finished VFET semiconductor device are known to those skilled in the art so have been omitted in the interest of brevity.

In accordance with embodiments of the invention, each of the VFETs 120, 130 in the performance region 104 is formed with a gate 122, 132 having a relatively thick gate thickness dimension T. In accordance with embodiments of the invention, each of the VFETs 140, 150 in the density region 106 is formed with a gate 142, 152 having a relatively thin gate thickness dimension T'. In embodiments of the invention, the thickness dimension T of the thick gates 122, 132 is greater than the thickness dimension T' of the thin gates 142, 152.

In embodiments of the invention, the thick gates 122, 132 of the VFETs 120, 130 in the performance region 104 form the portions of the circuitry on the substrate 102 that require relatively higher performance characteristics. More specifically, for the VFETs 120, 130 and other elements that make up the circuitry in the performance region 104, the VFET performance characteristics are more important than the VFET density characteristics. One example of improving or optimizing a transistor performance characteristic is reducing the transistor's gate resistance. For the VFETs 120, 130 in the performance region 104, gate resistance can be optimized by providing each of the gates 122, 132 with a higher thickness dimension T. Optimizing gate resistance to a lower level improves VFET performance by allowing the VFET to switch faster and more accurately. For example, many of the high performance characteristics of high performance logic circuits can be achieved by forming the high performance logic circuits from transistors (e.g., VFETs) having relatively thick gates. However, providing transistor gates with a higher thickness dimension limits the minimum transistor pitch (e.g., the "Larger Gate Pitch" shown in FIG. 1), which is acceptable for the VFETs 120, 130 in the performance region 104 because, for the VFETs 120, 130 in the performance region 104, the performance characteristics of each VFET 120, 130 are more important than VFET density.

In embodiments of the invention, the thinner gates 142, 152 of the VFETs 140, 150 in the density region 106 form the portions of the circuitry on the substrate 102 that require relatively high VFET density. More specifically, for the VFETs 140, 150 and other elements that make up the circuitry in the density region 106, VFET density is more important than the VFET performance characteristics. In embodiments of the invention, the VFETs and other elements that make up the circuitry in the density region 106 can be memory such as SRAM. For memory circuitry, high-performance is less critical than device density. The memory circuitry formed from the VFETs 140, 150 in the density region 106 includes various schemes (e.g., redundancy) that compensate for the higher failure rates that can result from having traded off the lower transistor performance that can result from having thinner gates (and higher gate resistance) in favor of the higher density that can results from having thinner gates. Providing the VFET gates 142, 152 with a relatively lower thickness dimension T' maximizes the transistor pitch (e.g., the "Reduced Gate Pitch" shown in FIG. 1), which is acceptable for the VFETs 140, 150 because, for the circuitry (e.g., memory) formed from the VFETs 140, 150 in the density region 106, VFET density is more important than VFET performance.

Figure 2:
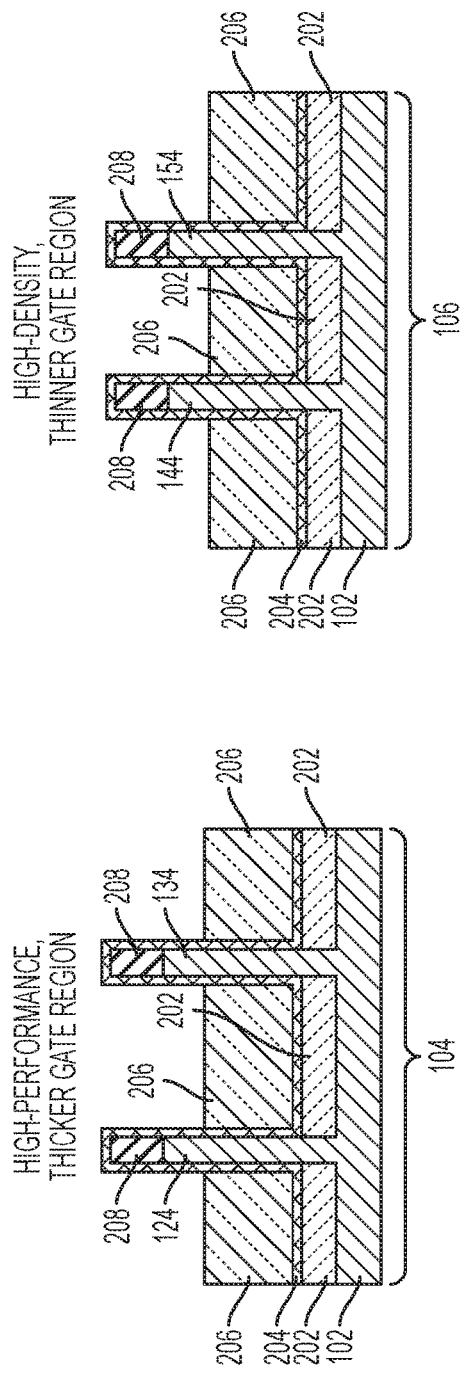
FIG. 2 depicts a cross-sectional view of a semiconductor substrate having a performance region and a density region after fabrication operations according to embodiments of the invention.

The substrate 102, which includes VFETs 120, 130 formed in the performance region 104 and VFETs 140, 150 formed in the density region 106, can be fabricated according to the fabrication methodologies that are illustrated in FIGS. 2-8 and described in detail subsequently herein. More specifically, FIGS. 2-8 depict cross-sectional views of the semiconductor substrate 102 having performance region 104 and density region 106 after various fabrication operation according to embodiments of the invention. As shown in FIG. 2, the performance region 104 includes the substrate 102, channel fins 122, 132, bottom spacer regions 202, a gate dielectric layer 204, an initial gate metal structure 206, and fin hard masks 208, configured and arranged as shown. As also shown in FIG. 2, the density region 106 includes the substrate 102, channel fins 142, 152, bottom spacer regions 202, the gate dielectric layer 204, the initial gate metal structure 206, and fin hard masks 208, configured and arranged as shown. The structures shown in FIG. 2 can be fabricated using a variety of well-known semiconductor device fabrication processes, which, in the interest of brevity, may or may not be described in significant detail herein.

The substrate 102 can be any suitable substrate material, such as, for example, monocrystalline Si, SiGe, SiC, III-V compound semiconductor, II-VI compound semiconductor, or semiconductor-on-insulator (SOI). In some embodiments of the invention, the substrate 102 includes a buried oxide layer (not depicted). Although not depicted in the figures, in the final VFET device, a source/drain (S/D) region can be formed across from a major surface of a substrate 102. In some embodiments of the invention, the S/D region can be formed later in the fabrication process. In some embodiments of the invention, the S/D region can be epitaxially grown, and the S/D region can be doped through in-situ doping during the epitaxial growth process, or through ion implantation after the S/D region is formed. The S/D region can be doped by any suitable doping techniques, including but not limited to, ion implantation, gas phase doping, plasma doping, plasma immersion ion implantation, cluster doping, infusion doping, liquid phase doping, solid phase doping, in-situ epitaxy growth, or any suitable combination of those techniques.

Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, germanium, and/or carbon doped silicon (Si:C) can be doped during deposition (in-situ doped) by adding dopants, n-type dopants (e.g., phosphorus or arsenic) or p-type dopants (e.g., boron or gallium), depending on the type of transistor. The dopant concentration in the source/drain can range from $1\times10^{19}$ cm$^{-3}$ to $2\times10^{21}$ cm$^{-3}$, or preferably between $2\times10^{20}$ cm$^{-3}$ and $1\times10^{21}$ cm$^{-3}$.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments of the invention, epitaxial growth and/or deposition processes are selective to forming on semiconductor surface, and generally do not deposit material on exposed surfaces, such as silicon dioxide or silicon nitride surfaces.

In some embodiments of the invention, the gas source for the deposition of epitaxial semiconductor material include a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

The hard masks 208 protect the channel fins 124, 134, 144, 154 during fabrication thereof. The hard masks 208 can be deposited across from the substrate 102 using any suitable deposition process. For example, the hard masks 208 can be a dielectric such as silicon nitride (SiN), silicon oxide, or a combination of silicon oxide and silicon nitride. Conventional semiconductor device fabrication processes (e.g., patterning and lithography, self-aligned double patterning, self-aligned quadruple patterning) are used to remove portions of the substrate 102 and the hard masks 208 to form the channel fins 124, 134, 144, 154 and the hard masks 208. In some embodiments of the invention, the hard masks 208 are patterned to expose portions of the substrate 102. The exposed portions of the substrate 102 can then be removed or recessed to form the channel fins 124, 134, 144, 154 using a wet etch, a dry etch, or a combination thereof.

The channel fins 124, 134 can be electrically isolated from other region of the substrate 102 by a STI region 602 (shown in FIG. 6), which can be a dielectric material formed in the substrate using known STI fabrication methodologies. The channel fine 144, 154 can be electrically isolated from other regions of the substrate 102 by a STI region 604 (shown in FIG. 6). The STI regions 602, 604 can be formed from any suitable dielectric material, such as, for example, a silicon oxide. Embodiments of the invention further reduce the pitch in the density regions 106 of the substrate 102 by combining the pitch reduction that results from multiple gate thicknesses with pitch reductions that can be achieved through further leveraging the lower variability (i.e., more repetitive structures) in the density region 106. For example, because of the lower variability in the density region 106, additional reductions in pitch in the dense region can be achieved by making the width of the STI regions 604 in the density region 106 less than the width of the STI regions 602 in the performance region 104.

The bottom spacers 202 are formed over a major surface of the substrate 102 and adjacent to bottom portions of the channel fins 124, 134, 144, 154. The bottom spacers 202 can include a dielectric material, such as, for example, SiN, SiC, SiOC, SiCN, BN, SiBN, SiBCN, SiOCN, SiO$_x$N$_y$, and combinations thereof. The dielectric material can be a low-k material having a dielectric constant less than about 7, less than about 5, or even less than about 2.5. The bottom spacers 202 can be formed using known deposition processes, such as, for example, CVD, PECVD, ALD, PVD, chemical solution deposition, or other like processes.

The initial gate structure includes a gate conductor 206 (e.g., a work function metal (WFM)) and one or more gate dielectric films 204 is deposited over the bottom spacer 202 and adjacent to the channel fin 124, 134, 144, 154. In some embodiments of the invention, the gate conductor 206 can be overfilled above a top surface of the hard masks 208, planarized to substantially the same level as the top surface of the hard masks 208 using, for example, CMP, and then recessed to the level depicted in FIG. 2. The gate conductor 206 can be recessed using any suitable process, such as, for example, a wet etch, a dry etch, or a combination thereof.

The one or more gate dielectric films 204 can be a dielectric material having a dielectric constant greater than, for example, 3.9, 7.0, or 10.0. Non-limiting examples of suitable materials for the high-k dielectric films include oxides, nitrides, oxynitrides, silicates (e.g., metal silicates), aluminates, titanates, nitrides, or any combination thereof. Examples of high-k materials with a dielectric constant greater than 7.0 include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The gate dielectric films 204 can further include dopants such as, for example, lanthanum and aluminum. The gate dielectric films 204 can be formed by suitable deposition processes, for example, CVD, PECVD, atomic layer deposition (ALD), evaporation, physical vapor deposition (PVD), chemical solution deposition, or other like processes. The thickness of the gate dielectric films 204 can vary depending on the deposition process as well as the composition and number of high-k dielectric materials used.

The gate conductor 206 can include doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. In some embodiments of the invention, the gate conductor 206 can be a WFM deposited over the gate dielectric films 204 by a suitable deposition process, for example, CVD, PECVD, PVD, plating, thermal or e-beam evaporation, and sputtering. The type of WFM depends on the type of transistor and can differ between the nFET and pFET devices. P-type WFMs include compositions such as ruthenium, palladium, platinum, cobalt, nickel, and conductive metal oxides, or any combination thereof. N-type WFMs include compositions such as hafnium, zirconium, titanium, tantalum, aluminum, metal carbides (e.g., hafnium carbide, zirconium carbide, titanium carbide, and aluminum carbide), aluminides, or any combination thereof. The gate conductor 206 can further include a tungsten (W), titanium (Ti), aluminum (Al), cobalt (Co), or nickel (Ni) over WFM layer. The gate conductor 206 can be deposited by a suitable deposition process, for example, CVD, PECVD, PVD, plating, thermal or e-beam evaporation, and sputtering.

Figure 3:
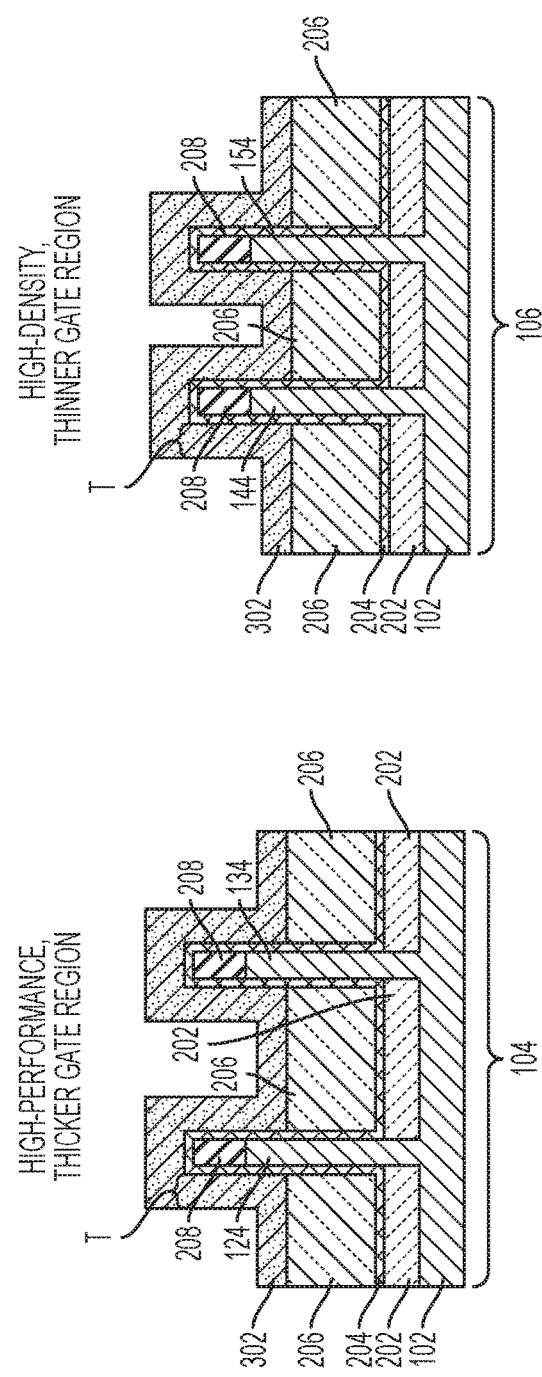
FIG. 3 depicts a cross-sectional view of a semiconductor substrate having a performance region and a density region after a fabrication operation according to embodiments of the invention.

As shown in FIG. 3, a layer of top spacer material 302 has been conformally deposited over the gate conductor 206 and the gate dielectric 204 during a fabrication operation according to embodiments of the invention. The top spacer material 302 can be any suitable dielectric material, such as, for example, an oxide or a silicon oxide. The top spacer material 302 can be conformally formed using a CVD, PECVD, ALD, PVD, chemical solution deposition, or other like process. A sufficient amount of the top spacer material 302 is deposited to provide a thickness dimension T, which, according to embodiments of the invention, corresponds to the desired thickness dimension T for the relatively thick gates 122, 132 (shown in FIG. 1) of the thick gate, high performance VFETs 120, 130 (shown in FIG. 1) that will be formed in the performance region 104. At this stage of the example fabrication process, the thickness dimension T of the top spacer material 302 is provided in the performance region 104 and the density region 106 of the substrate 102.

As shown in FIG. 4, the layer of top spacer material 302 (shown in FIG. 3) has been etched in a substantially vertical direction to expose top surfaces of the gate conductor 204, expose top surfaces of the gate dielectric 204, and form relatively thick top spacers 402 having the thickness dimension T. The top spacer material 302 can be vertically etched using any suitable process, such as, for example, a wet etch, a dry etch, or a combination thereof.

As shown in FIG. 5, a mask 502 is formed over the performance region 104. In the unmasked density region 106, the relatively thick top spacers 402 (shown in FIG. 4) have been thinned to form relatively thin top spacers 504. In embodiments of the invention, the relatively thick top spacers 402 in the density region 106 can be thinned by applying a removal process (e.g., a horizontally/laterally directed etch) at the exposed sidewall surface of the relatively thick top spacers 402 that proceeds laterally (i.e., horizontally) with respect to the major surface of the substrate 102. A sufficient amount of the relatively thick top spacer 402 is removed to provide a thickness dimension T', which, according to embodiments of the invention, corresponds to the desired thickness dimension T' for the relatively thin gates 142, 152 (shown in FIG. 1) of the thinner gate, high performance VFETs 140, 150 (shown in FIG. 1) that will be formed in the density region 106. At this stage of the fabrication process, the thickness dimension T of the top spacers 402 is provided in the performance region 104 of the substrate 102, and the thickness dimension T' of the top spacers 504 is provided in the density region 106 of the substrate 102. In embodiments of the invention the thickness dimension T is greater than the thickness dimension T'.

Figure 6:
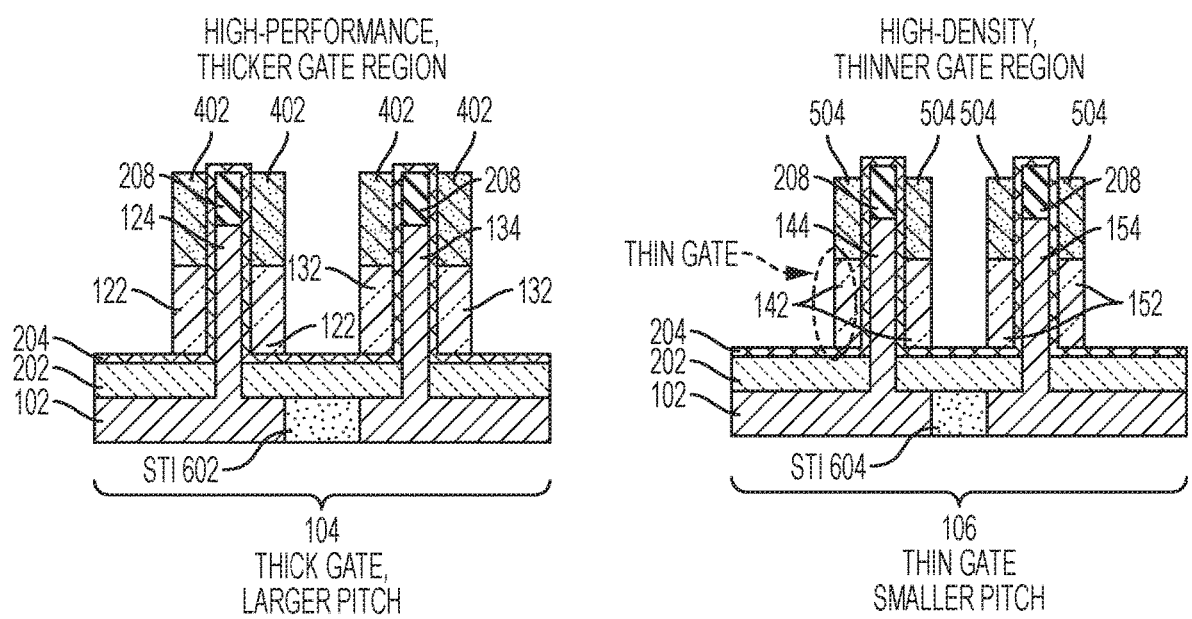
FIG. 6 depicts a cross-sectional view of a semiconductor substrate having a performance region and a density region after a fabrication operation according to embodiments of the invention.

As shown in FIG. 6, the mask 502 has been removed from the performance region 104, and exposed surfaces of the gate conductor 206 in the performance region 104 and the density region 106 have been etched to expose top surfaces of the gate dielectric 204, and to form the relatively thick gates 122, 132 in the performance region 104 and the relatively thin gates 142, 152 in the density region 106. In some embodiments of the invention, the gate conductor 206 can be recessed using any suitable process, such as, for example, a wet etch, a dry etch, or a combination thereof. The thickness dimension T of the relatively thick spacers 402 defines the thickness dimension of relatively thick gates 122, 132 in the performance region 104. The thickness dimension T' of the relatively thin spacers 504 defines the thickness dimension of relatively thin gates 142, 152 in the density region 106.

FIG. 7 depicts an alternative approach to forming the relatively thick gates 122, 132 (shown in FIG. 1) in a performance region 104A of the substrate 102, and forming the relatively thin gates 142, 152 (shown in FIG. 1) in a density region 106A of the substrate 102. The VFET structures formed in the performance region 104A and the density region 106A, along with the performance region 104A and the density region 106A themselves, are substantially the same as the VFET structures, performance region 104, and density region 106 shown in FIG. 2 except the gate conductor 206A in FIG. 7 is deposited conformally in the performance region 104A and the density region 106A. In embodiments of the invention, a sufficient amount of the gate conductor 206A is deposited to provide a thickness dimension T, which, according to embodiments of the invention, corresponds to the desired thickness dimension T for the relatively thick gates 122, 132 of the thick gate, high performance VFETs 120, 130 (shown in FIG. 1) that will be formed in the performance region 104A.

At this stage of the fabrication process, the thickness dimension T of the gate conductor 206A is provided in the performance region 104A and in the density region 106A of the substrate 102. A mask 502A is formed over the performance region 104A, and the gate conductor 206A is removed or thinned in the horizontal/lateral direction to form a gate conductor 206A' in the density region 106A. In embodiments of the invention, a sufficient amount of the gate conductor 206A is removed to provide a thickness dimension T', which, according to embodiments of the invention, corresponds to the desired thickness dimension T' for the relatively thin gates 142, 152 of the thin gate, high density VFETs 140, 150 (shown in FIG. 1) that will be formed in the density region 106A. Subsequent fabrication processes (e.g., further etching the gate conductors 206A, 206A' to form the gates 122, 132, 142, 152 (shown in FIG.

1), the formation of source/drain regions, the formation of gate contacts, etc.) are applied to the VFET structures shown in FIG. 7 to form the VFETs 120, 130, 140, 150 (shown in FIG. 1). The details of suitable subsequent fabrication processes to form a finished VFET semiconductor device are known to those skilled in the art so have been omitted in the interest of brevity.

FIG. 8 depicts an alternative approach to forming the relatively thick gates 122, 132 (shown in FIG. 1) in a performance region 104B of the substrate 102, and forming the relatively thin gates 142, 152 (shown in FIG. 1) in a density region 106B of the substrate 102. The VFET structures formed in the performance region 104B and the density region 106B, along with the performance region 104B and the density region 106B themselves, are substantially the same as the VFET structures, performance region 104, and density region 106 shown in FIG. 4 except that, in a subsequent fabrication operation, a mask 502B is formed over the performance region 104B, and, in the density region 106B, the top spacer material 302 has been removed or thinned to form a top spacer material 302A. In embodiments of the invention, a sufficient amount of the spacer material 302 is removed in a horizontal/lateral direction to provide a thickness dimension T', which, according to embodiments of the invention, corresponds to the desired thickness dimension T' for the relatively thin gates 142, 152 of the thin gate, high density VFETs 140, 150 (shown in FIG. 1) that will be formed in the density region 106B. Subsequent fabrication processes (e.g., further etching the top spacer materials 302, 302A to form top spacers 402, 504 (shown in FIG. 5), etching to form the gates 122, 132, 142, 152 (shown in FIGS. 1 and 6), the formation of source/drain regions, the formation of gate contacts, etc.) are applied to form the VFETs 120, 130, 140, 150 (shown in FIG. 1). The details of suitable subsequent fabrication processes to form a finished VFET semiconductor device are known to those skilled in the art so have been omitted in the interest of brevity.

Figure 9:
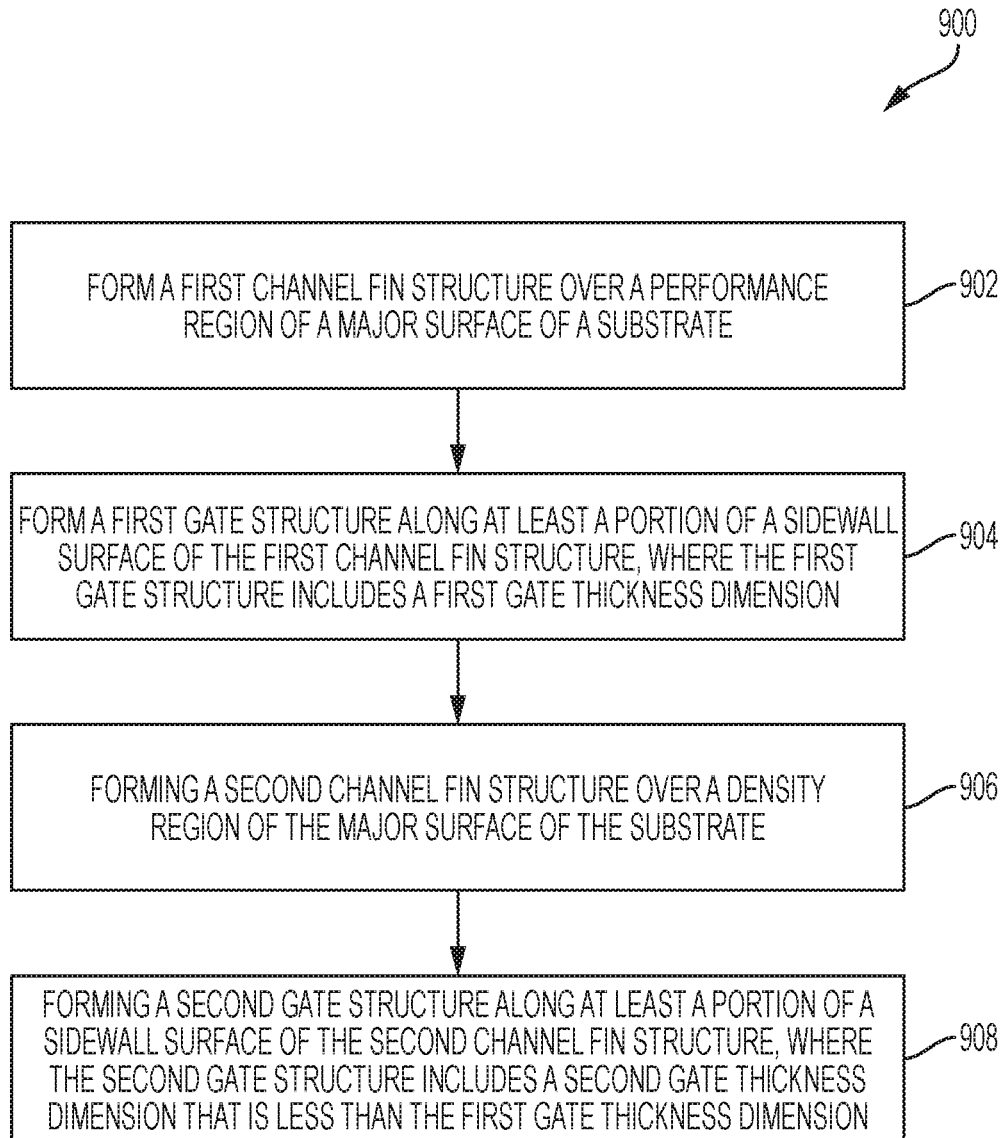
FIG. 9 depicts a flow diagram illustrating a fabrication methodology according to one or more embodiments of the invention.

FIG. 9 depicts a flow diagram illustrating a fabrication methodology 900 according to embodiments of the invention. At block 902 of the methodology 900, a first channel fin structure is formed over a performance region of a major surface of a substrate. At block 904, a first gate structure is formed along at least a portion of a sidewall surface of the first channel fin structure, where the first gate structure includes a first gate thickness dimension. At block 906, a second channel fin structure is formed over a density region of the major surface of the substrate. At block 908, a second gate structure is formed along at least a portion of a sidewall surface of the second channel fin structure, where the second gate structure includes a second gate thickness dimension that is less than the first gate thickness dimension.

Figure 10:
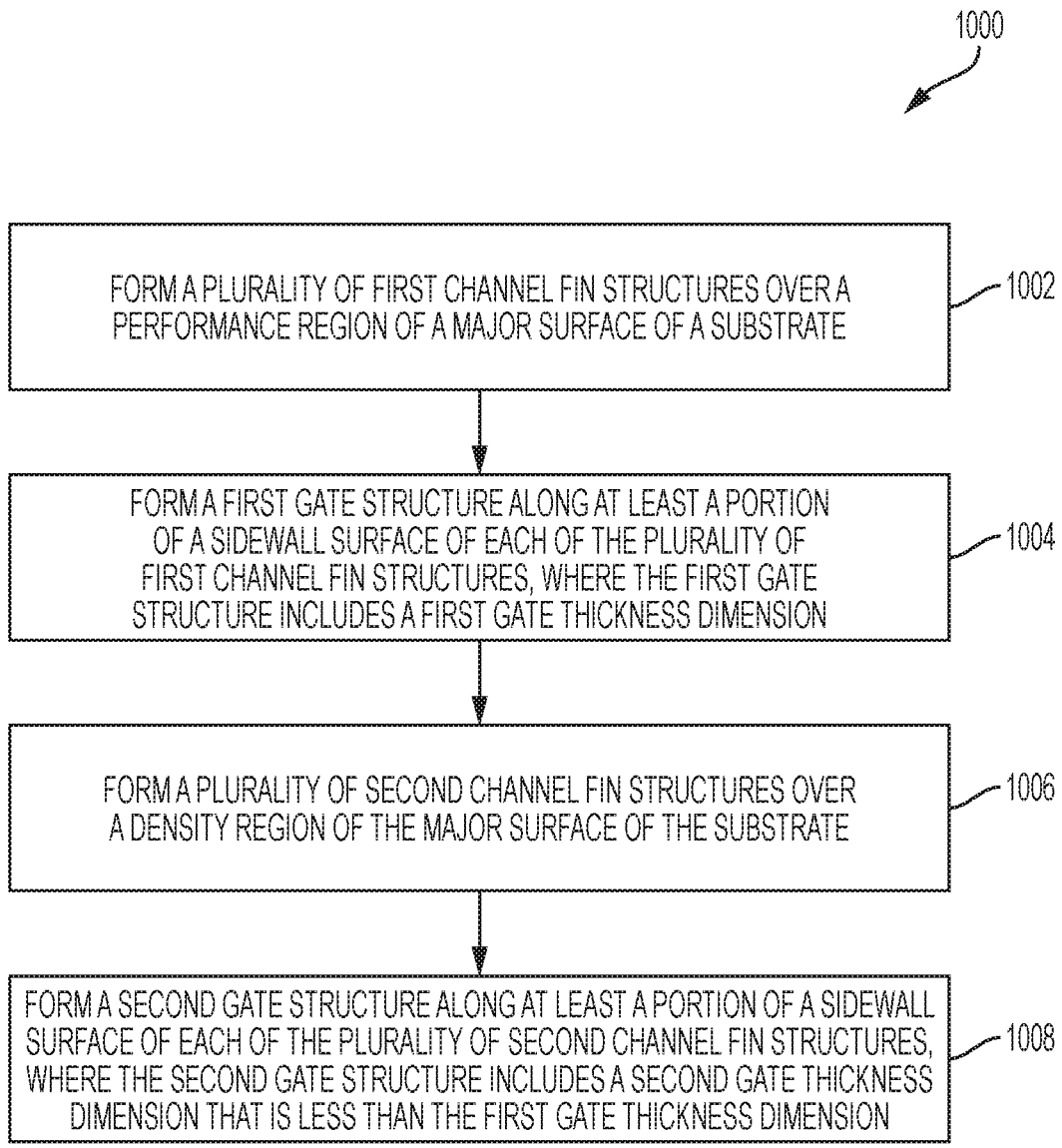
FIG. 10 depicts a flow diagram illustrating a fabrication methodology according to one or more embodiments of the invention.

FIG. 10 depicts a flow diagram illustrating a fabrication methodology 1000 according to one or more embodiments of the invention. At block 1002 of the methodology 1000, a plurality of first channel fin structures is formed over a performance region of a major surface of a substrate. At block 1004, a first gate structure is formed along at least a portion of a sidewall surface of each of the plurality of first channel fin structures, where the first gate structure includes a first gate thickness dimension. At block 1006, a plurality of second channel fin structures is formed over a density region of the major surface of the substrate. At block 1008, a second gate structure is formed along at least a portion of a sidewall surface of each of the plurality of second channel fin structures, where the second gate structure includes a second gate thickness dimension that is less than the first gate thickness dimension.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A configuration of semiconductor devices, the configuration comprising:
   a plurality of performance-based circuits comprising a plurality of first transistors formed over a performance region of a major surface of a substrate;
   where each of the plurality of first transistors comprises:
      a first channel fin structure; and
      a first gate structure along at least a portion of a sidewall surface of the first channel fin structure;
      where the first gate structure comprises a first gate thickness dimension; and
   a plurality of density-based circuits comprising a plurality of second transistors formed over a density region of the major surface of the substrate, where the plurality of density-based circuits includes a number of repetitive density-based circuits;
   where each of the plurality of second transistors comprises:
      a second channel fin structure; and
      a second gate structure along at least a portion of a sidewall surface of the second channel fin structure;

where the second gate structure comprises a second gate thickness dimension that is less than the first gate thickness dimension;

where the repetitive density-based circuits are configured to compensate for a failure rate of the plurality of density-based circuits;

where each of the plurality of first transistors comprises a first vertical field effect (VFET) transistor having a first fin-shaped VFET channel and a first VFET gate:

where the first channel fin structure comprises the first fin-shaped VFET channel;

where the first channel gate structure comprises the first VFET gate;

where each of the plurality of second transistors comprises a second VFET transistor having a second fin-shaped VFET channel and a second VFET gate;

where the second channel fin structure comprises the second fin-shaped VFET channel; and where the second gate structure comprises the second VFET gate.

2. The configuration of claim 1, where:

a first gate pitch dimension comprises a distance from a selected location on a first gate structure of any one of the plurality of first transistors to a corresponding point on a first gate structure of an adjacent one of the plurality of first transistors.

3. The configuration of claim 2, where:

a second gate pitch dimension comprises a distance from a selected location on a second gate structure of any one of the plurality of second transistors to a corresponding point on a second gate structure of an adjacent one of the plurality of transistors.

4. The configuration of claim 3, where the second gate pitch is less than the first gate pitch.

5. The configuration of claim 1, where a width dimension of the first channel fin structure is substantially the same as a width dimension of the second channel fin structure.

6. The configuration of claim 1, where:

each of the plurality of first transistors further comprises a first gate dielectric;

each of the plurality of second transistors further comprises a second gate dielectric; and a width dimension of the first gate dielectric is substantially the same as a width dimension of the second gate dielectric.

7. The configuration of claim 1, where:

a space between adjacent ones of the first gate structures is larger than a space between adjacent ones of the second gate structures.

8. The configuration of claim 1 further comprising:

first shallow trench isolation (STI) regions between each of the plurality of first transistors;

second STI regions between each of the plurality of second transistors;

where a width dimension of the first STI region is greater than a width dimension of the second STI region.

* * * * *